(12) United States Patent
Waite et al.

(10) Patent No.: US 7,183,169 B1
(45) Date of Patent: Feb. 27, 2007

(54) METHOD AND ARRANGEMENT FOR REDUCING SOURCE/DRAIN RESISTANCE WITH EPITAXIAL GROWTH

(75) Inventors: Andrew M. Waite, Hopewell Junction, NY (US); Scott Luning, Poughkeepsie, NY (US); Philip A. Fisher, Fishkill, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 18 days.

(21) Appl. No.: 11/072,312

(22) Filed: Mar. 7, 2005

(51) Int. Cl.
*H01L 21/336* (2006.01)

(52) U.S. Cl. .................. 438/305; 438/303; 438/306; 257/E29.027; 257/21.438

(58) Field of Classification Search .............. 438/306, 438/305, 283, 284, 303, 157; 257/E29.027, 257/E29.021, E29.024, E29.026, E21.438, 257/E21.093, E21.116, E21.115
See application file for complete search history.

(56) References Cited

U.S. PATENT DOCUMENTS

| 6,043,545 | A  | * | 3/2000  | Tseng et al.    | 257/408 |
| 6,225,176 | B1 | * | 5/2001  | Yu              | 438/305 |
| 6,399,451 | B1 | * | 6/2002  | Lim et al.      | 438/303 |
| 6,441,435 | B1 | * | 8/2002  | Chan            | 257/347 |
| 6,677,212 | B1 | * | 1/2004  | Yoshioka et al. | 438/303 |
| 6,713,393 | B2 | * | 3/2004  | Wu              | 438/689 |
| 6,747,328 | B2 | * | 6/2004  | Wu              | 257/412 |
| 2004/0004259 | A1 | * | 1/2004  | Wu           | 257/411 |
| 2004/0256663 | A1 | * | 12/2004 | Kihara       | 257/320 |
| 2006/0014351 | A1 | * | 1/2006  | Lo et al.    | 438/305 |
| 2006/0152086 | A1 | * | 7/2006  | Venezia et al. | 307/112 |

* cited by examiner

*Primary Examiner*—Walter Lindsay, Jr.

(57) ABSTRACT

A method and arrangement for reducing the series resistance of the source and drain in a MOSFET device provides for epitaxially grown regions on top of the source and drain extensions to cover portions of the top surfaces of the silicide regions formed on the substrate. The epitaxial material provides an extra flow path for current to flow through to the silicide from the extension, as well as increasing the surface area between the source/drain and the silicide to reduce the contact resistance between the source/drain and the silicide.

15 Claims, 2 Drawing Sheets

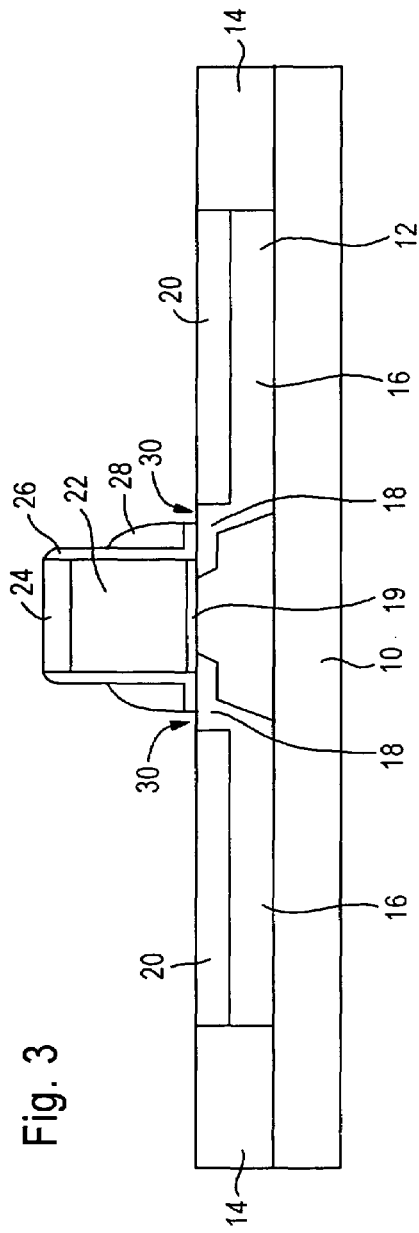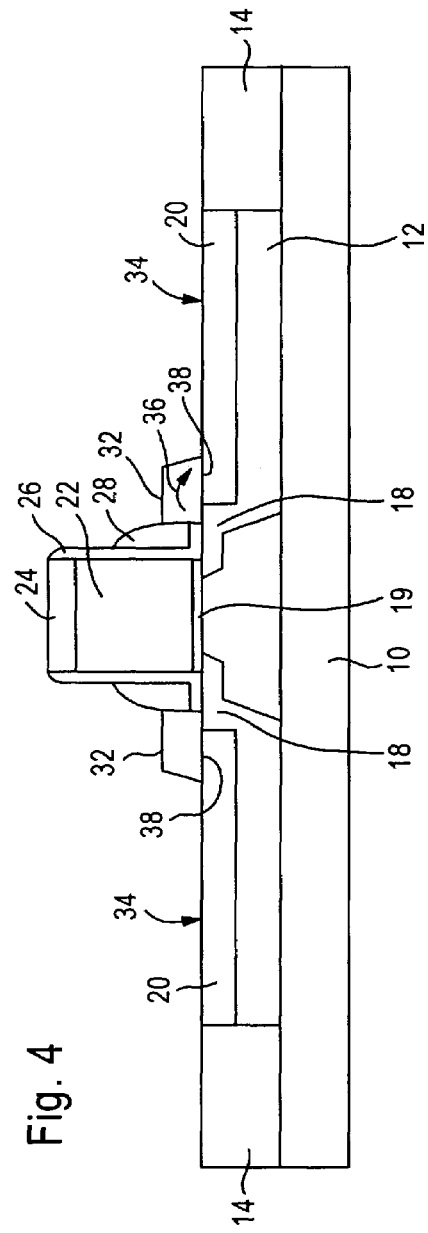

METHOD AND ARRANGEMENT FOR REDUCING SOURCE/DRAIN RESISTANCE WITH EPITAXIAL GROWTH

FIELD OF THE INVENTION

The present invention relates to the field of semiconductor manufacturing, and more particularly, to arrangements with reduced source/drain series resistance.

BACKGROUND OF THE INVENTION

Metal oxide semiconductor field effect transistors (MOSFETs) are electronic devices used in microprocessors and other fast data switching components. Recently, silicon-on-insulator (SOI) device designs have been of particular interest due to the high potential of silicon for high-performance structure fabrication. As the silicon film thickness of SOI transistors is reduced, for high-performance MOS fabrication, many designs increase the thickness of the source/drain regions of the MOSFET device above the initial silicon thickness. This results from the fact that, as the SOI film becomes thinner, there exists a reduced amount of silicon material from which to form silicide for source/drain contacts. Additionally, thinner source/drain regions can degrade on-current due to increased series resistance. The performance of MOSFET devices is limited by the series resistance of the source and drain. The series resistance consists of the spreading resistances in the silicon source/drain and or source/drain extension regions and the contact resistance between the silicon in the source/drain regions and the silicide.

One arrangement that attempts to overcome this concern provides epitaxial growth of silicon on top of the source and drain regions in order to provide additional silicon for silicide. However, a key limitation of this method is that the epitaxial growth has taken place at temperatures as high as 750° C., which causes significant transient enhanced diffusion (TED) of major dopants. The unnecessary dopant redistribution in HALO-extension regions degrades performance of devices and short channel immunity.

Other solutions to reducing the series resistance of the source and drain are to increase the dopant concentration of the source and drain, to reduce the proximity of the silicide to the edges of the channel, or to increase the thickness of the silicide. None of these methods significantly increases the surface area of the interface between the silicide and the silicon, needed to reduce contact resistance. Further, increasing the dopant concentration or reducing silicide proximity degrades short channel effect or enhances junction leakage.

SUMMARY OF THE INVENTION

There is a need for a method of reducing the source/drain series resistance within a semiconductor device without increasing the dopant concentration, reducing proximity of the silicide to the edges of the channel, or increasing the thickness of the silicide.

This and other needs are met by embodiments of the present invention which provide a method of forming a semiconductor device comprising the steps of forming a gate electrode on a substrate, forming source and drain extensions in the substrate, and forming source and drain regions in the substrate. Silicide regions are formed in the source and drain regions, and semiconductive regions are formed on top of the source and drain extensions and the silicide regions, thereby electrically coupling the top surfaces of the source and drain extension regions and the silicide regions.

By providing semiconductive regions on top of the source and drain extensions and the silicide regions, which electrically couple the top surfaces of the source and drain extensions and the silicide regions, the series resistance of the source and drain is reduced. The semiconductive material may be provided by the growth of low temperature in situ doped selective epitaxial material, such as silicon or silicon germanium, on the wafer after silicide formation. The epitaxial material provides an extra path for current to flow through to reach the silicide from the source and drain extensions. The increased surface area between the source/drain and the silicide, provided for by the epitaxial layer, reduces the contact resistance between the source/drain and the silicide.

The earlier stated needs are also met by other aspects of the invention which provide a method of forming a semiconductor arrangement comprising the steps of forming a semiconductor device having a gate electrode on a semiconductor substrate that has source drain regions, source and drain extensions, and silicide regions within the source and drain regions. The method also comprises forming semiconductive interfaces between the source and drain extensions and top surfaces of the silicide regions.

The earlier stated needs are also met by still further aspects of the present invention which provide a semiconductor arrangement comprising a semiconductor substrate, source and drain regions in the substrate, source and drain extensions in the substrate, silicide regions in the substrate, and a gate electrode on the substrate. Semiconductive material is provided that contacts and electrically couples top surfaces of the source and drain extensions to top surfaces of the silicide regions.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 3 depicts the structure of FIG. 2 after an oxide liner has been partially removed in accordance with embodiments of the present invention.

FIG. 4 shows the structure of FIG. 3 following a selective epitaxial growth process in which semiconductive material is formed on top of the source and drain extensions and the silicide regions, in accordance with embodiments of the present invention.

DETAILED DESCRIPTION OF THE INVENTION

The present invention addresses and solves problems related to limitations on the performance of MOSFET devices created by the series resistance of the source and drain. In particular, the series resistance, consisting of spreading resistances of the extension region and the contact resistance between the silicon in the source/drain and the silicide, tends to limit the performance of MOSFET devices. The invention reduces the series resistance of the source and drain by the formation of semiconductive material on top of the source/drain extensions and the silicide regions formed on the substrate. This may be accomplished by the growth of low temperature in situ doped selective epitaxial material, such as silicon or silicon germanium, on the wafer after a silicide formation. The epitaxial material provides an extra path for current to flow through to reach the silicide from the extension. The increased surface area between the source/drain and the silicide, provided by the epitaxial material, reduces the contact resistance between the source/drain and the silicide.

Figure 1:
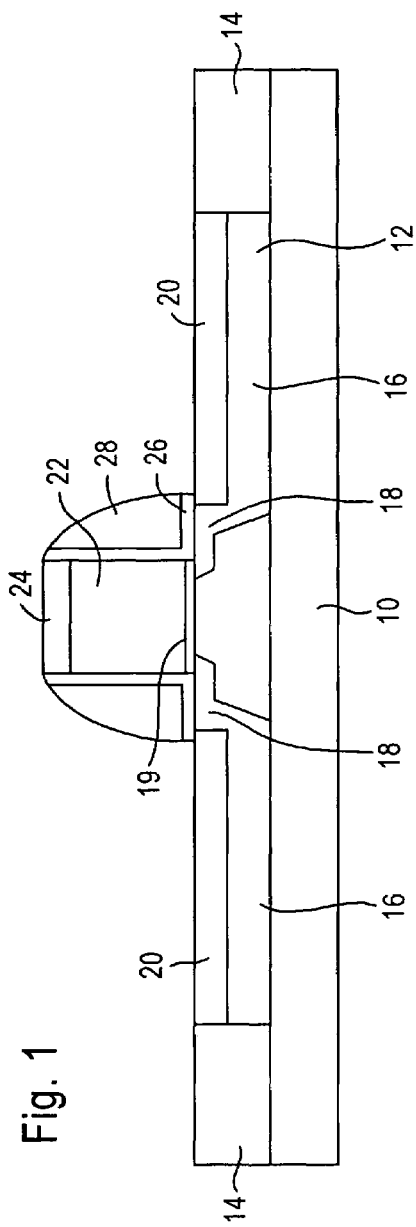
FIG. 1 is a schematic cross-sectional view of a MOSFET following processing up to the formation of silicide in accordance with embodiments of the present invention.

FIG. 1 is a schematic cross-sectional depiction of a semiconductor device during one phase of manufacture in accordance with embodiments of the present invention. In the exemplary described embodiment, the semiconductor arrangement is a semiconductor-on-insulator (SOI) arrangement. However, the present invention may be applied to other types of semiconductor arrangements, such as transistors formed on bulk substrates and is not limited to SOI devices.

An insulator layer, such as a buried oxide layer 10, has a semiconductor substrate region 12 formed thereon. The semiconductor region 12 is separated from other such regions by isolation regions, such as shallow trench isolation (STI) oxide regions 14. Within the substrate 12 are formed source and drain regions 16. Also provided within the semiconductor substrate 12 are source and drain extensions 18. Silicide regions 20 are formed in the source and drain regions 16 by conventional silicide processing techniques.

A gate electrode 22, such as a polysilicon gate electrode, is provided on the substrate 12. The gate electrode 22 may include a silicide region 24 that may or may not be formed at the same time as the silicide regions 20 in the substrate 10. A gate dielectric 19 separates the polysilicon gate electrode 22 from the semiconductor substrate region 12. A liner 26, such as an oxide liner, is provided on the sides of the gate electrode 22 and on the top surface over the source and drain extensions 18. Sidewall spacers 28 are provided on the sidewalls of the gate electrode 22, with the liner 26 interposed therebetween. The sidewall spacers 28 are employed to mask the previously formed source and drain extensions 18 during the doping of the source/drain regions 16. They also protect the sidewalls of the gate electrode 22 from silicidation during the silicide formation process. The formation of the arrangement in FIG. 1 can be performed in a conventional manner.

Figure 2:
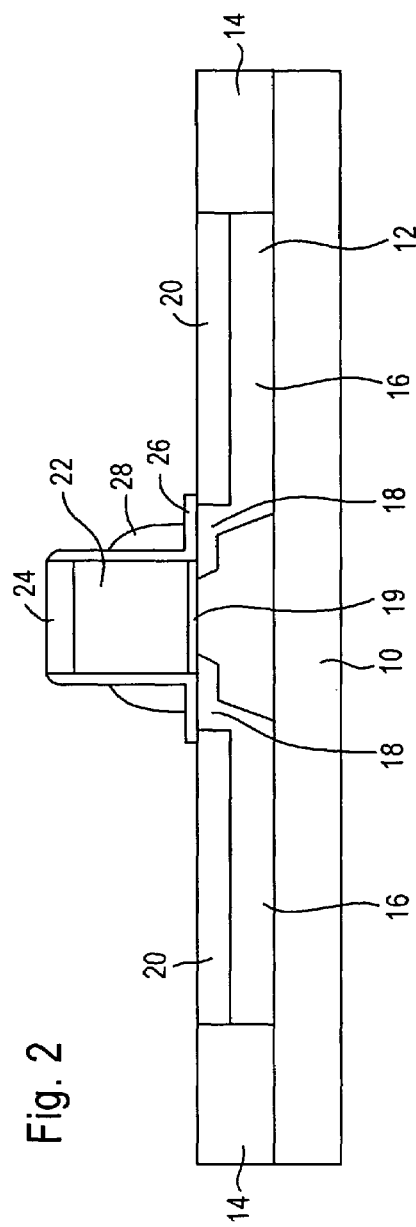
FIG. 2 depicts the structure of FIG. 1 following the partial removal of spacers in accordance with embodiments of the present invention.

FIG. 2 shows the structure of FIG. 1 following a partial removal of the spacers 28 in accordance with embodiments of the present invention. This may be accomplished with minimal damage to the silicide regions 20, 24 by chemical downstream etching (CDE), as one example. The CDE process is a dry process in which a plasma is generated remotely from the wafer. The process uses ionized gas species to etch layers on wafers, but unlike RIE, the wafer is remote from the plasma. There are known CDE techniques that etch $Si_3N_4$, such as used in typical spacers, very selectively to silicon dioxide or silicon. Such techniques may be employed here.

In other embodiments, the spacers 28 are completely removed, for example, by selective dry etching. Following the complete removal of the spacers, replacement spacers are formed on the polysilicon sidewalls, but are only built up to be narrower than the spacers that were completely removed. Accordingly, portions of the top surfaces of the source and drain extension will be exposed, following etching of the oxide liner 26.

FIG. 3 shows the structure of FIG. 2 following the etching of the oxide liner 26 to expose a top surface 30 of the source drain extensions 18. The liner 26 may be removed by reactive ion etching (RIE) for example. The remaining sidewall spacers 28 may be spacers which have been partially removed, or may comprise replacement spacers after the complete removal and replacement, as in the embodiments described above.

FIG. 4 depicts the structure of FIG. 3 following the formation of semiconductive regions 32 on the top surface 30 of the source/drain extensions 18 and a portion of the top surface 34 of the silicide regions 20. In embodiments of the present invention, the semiconductive regions are formed by an in-situ doped selective epitaxial material growth process. The growth starts at the silicon or silicon germanium exposed at the top surface 30. For PFETs, the epitaxial material can be in situ boron doped silicon germanium (SiGe).

During growth of selective epitaxial material on top surface 30 of the source/drain extensions 18, depending upon the growth recipe used in the epitaxy reactor, semiconductor material may or may not be deposited on top of the silicide regions 20, 24. This will not interfere with the operation of the structure.

One of the concerns with growing epitaxial material is the relatively high temperature normally required and its deleterious effect on the stability of silicide. In the present invention, the selective epitaxially grown semiconductive material 32, such as doped silicon or boron doped silicon germanium, is performed at a temperature at which the silicide regions 20, 24 are stable. When the example of in situ boron doped silicon germanium is used, the selective epitaxial growth process may be performed at approximately 550° C. An exemplary silicide that is stable at such a temperature is (NiPt)Si. Hence, the proper selection of the combination of selective epitaxial material and growth process, as well as the particular silicide, permits a semiconductive material to be selectively epitaxially grown on the source/drain extensions 18 and on top of the silicide regions 20.

An exemplary growth process employs process conditions such that epitaxial Si or SiGe are grown on exposed silicon surfaces, but polysilicon is not deposited on dielectric materials such as $SiO_2$ or $Si_3N_4$. Exemplary process conditions include growth temperature greater than 525° C., but below the temperature at which the silicide becomes unstable. The growth pressure is between 1 and 40 torr. For SiGe growth, a gas mixture of $H_2$, $SiH_4$, $GeH_4$ and diborane can be used. Other gas mixtures that could be used include dichlorosilane or HCL. Growth rates are typically between about 10 Å and 500 Å/minute.

Arrows 36 in FIG. 4 depict the extra current flow path provided by the epitaxial semiconductive material 32. This extra current flow path through the epitaxial semiconductive material 32 reduces the spreading resistance of the source and drain. An additional silicon/silicide interface area 36 is also provided by the epitaxial semiconductive material 32. This additional contact area between the epitaxial semiconductive material and the silicide region 20 reduces the contact resistance between the source and drains 16 and the silicide regions 20.

With the present invention, the spreading resistance and the contact resistance are both reduced, thereby mitigating the limitation on the performance of MOSFET devices created by the series resistance of the source and drain. This is achieved in a production worthy method.

Although the present invention has been described and illustrated in detail, it is to be clearly understood that the same is way of illustration and example only and is not to be taken by way of limitation, the scope of the present invention being limited only by the terms of the appended claims.

What is claimed is:

1. A method of forming a semiconductor device, comprising the steps:

forming a gate electrode on a substrate;

forming source and drain extensions in the substrate;

forming source and drain regions in the substrate;

forming silicide regions in the source and drain regions; and forming semiconductor regions on top of the source and drain extensions and the silicide regions, thereby electrically coupling the top surfaces of the source and drain extensions and the silicide regions.

2. The method of claim 1, wherein the step of forming semiconductive regions includes selective epitaxially growing semiconductive material on the source and drain extensions, the semiconductive material growing over the silicide regions.

3. The method of claim 2, wherein the semiconductive material is doped SiGe or doped Si.

4. The method of claim 3, wherein the silicide regions comprise (NiPt)Si.

5. The method of claim 3, wherein the step of selective epitaxially growing semiconductive material is performed at approximately 550° C.

6. The method of claim 2, wherein the step of selective epitaxially growing semiconductive material is performed at a temperature at which the silicide regions are stable.

7. The method of claim 6, wherein an oxide liner and spacers are provided on the gate electrode, and further comprising removing a portion of the oxide liner and the spacers to expose portions of the source and drain extensions prior to selective epitaxially growing semiconductive material.

8. The method of claim 6, wherein an oxide liner and spacers are provided on the gate electrode, and further comprising removing the oxide liner and the spacers and forming replacement spacers on the gate electrode, the replacement spacers being narrower than the removed spacers such that portions of the source and drain extensions are exposed prior to selective epitaxially growing semiconductive material.

9. The method of claim 2, wherein the semiconductor device is an SOI device.

10. The method of forming a semiconductor, comprising the steps:

forming a semiconductor device having a gate electrode on a semiconductive substrate that has source and drain regions, source and drain extensions, and silicide regions within the source and drain regions; and forming semiconductive interfaces between the source and drain extensions and top surfaces of the silicide regions.

11. The method of claim 10, wherein the semiconductor interfaces comprise doped selective epitaxial growth semiconductive regions extending from the source and drain extensions to cover the top surface portions of the silicide region.

12. The method of claim 11, wherein the step of forming semiconductive interfaces comprises performing a selective epitaxial growth process at a temperature at which the silicide regions are stable.

13. The method of claim 12, wherein the selective epitaxial growth semiconductor regions comprise doped SiGe or doped Si.

14. The method of claim 13, wherein the silicide regions comprise (NiPt)Si, and the temperature at which the selective epitaxial growth process is performed is approximately 550° C.

15. The method of claim 14, further comprising forming spacers on the gate electrode that cover portions of the source and drain extensions, with other portions of the source and drain extensions remaining exposed prior to the selective epitaxial growth process.

* * * * *